United States Patent [19]

Iannucci

[11] Patent Number: 4,685,088
[45] Date of Patent: Aug. 4, 1987

[54] HIGH PERFORMANCE MEMORY SYSTEM UTILIZING PIPELINING TECHNIQUES

[75] Inventor: Robert A. Iannucci, Quincy, Mass.

[73] Assignee: International Business Machines Corporation, Armonk, N.Y.

[21] Appl. No.: 722,920

[22] Filed: Apr. 15, 1985

[51] Int. Cl.$^4$ .............................................. G11C 8/00
[52] U.S. Cl. .................... 365/230; 365/195; 365/194; 364/200
[58] Field of Search ............... 365/230, 189, 193, 233, 365/194, 195; 364/200 MS File, 900 MS File

[56] References Cited

U.S. PATENT DOCUMENTS

| | | | |
|---|---|---|---|
| 3,900,836 | 8/1975 | Salvo | 364/200 |
| 4,057,846 | 11/1977 | Cockerill et al. | 364/200 |
| 4,156,905 | 5/1979 | Fassbender | 364/200 |
| 4,253,147 | 2/1981 | MacDougall et al. | 364/200 |
| 4,509,142 | 4/1985 | Childers | 364/900 |

OTHER PUBLICATIONS

Davis et al., "Memory Decode Architecture", IBM Technical Disclosure Bulletin, vol. 27, No. 4A, Sep. 1984, pp. 2290-2291.

Primary Examiner—James W. Moffitt
Assistant Examiner—Glenn A. Gossage
Attorney, Agent, or Firm—Curtis G. Rose; John H. Bouchard; Maurice H. Klitzman

[57] ABSTRACT

A novel memory system is disclosed which utilizes pipelining techniques to read data from a memory array and to write data to a memory array. More data may be read from the novel memory system, within a unit of time, relative to the amount of data which may be read from a conventional memory system during the unit of time. The novel memory system comprises a plurality of standard elements which include a memory array, including a plurality of rows and columns, a row decoder, a row driver, column sense amplifiers, and a column multiplexer. However, the novel memory system further includes latch circuits interposed between the row decoder and the row driver, between the row driver and the memory array, between the memory array and the column sense amplifiers, and between the column sense amplifiers and the column multiplexer. The same number of latch circuits are interposed in serial fashion between the incoming row and column address bus and the column multiplexer. Consequently, as a result of the use of these latch circuits in a memory system, pipelining techniques are utilized in the memory system for the improvement of the performance of the memory system.

7 Claims, 6 Drawing Figures

HIGH PERFORMANCE MEMORY SYSTEM UTILIZING PIPELINING TECHNIQUES

BACKGROUND OF THE INVENTION

1. Field of the Invention

The present invention relates to memory systems, and more particularly, to a system and apparatus for improving the performance of a memory system.

2. Description of the Prior Art

An examination of a traditional, prior art memory system reveals a serious shortcoming: at any point in a memory cycle, only a small fraction of the total circuitry in the traditional memory system is active. As a result, the address and data buses of the memory chips in the traditional memory system are unnecessarily idle for a substantial period of time. Traditional solutions to this problem are typically expensive and are based on the use of time multiplexing across disjoint banks of memory chips. In the time multiplexing scheme, the individual memory chips are under-utilized, the memory chip addressing logic is complex, and the interleaving techniques performed by this time multiplexing scheme are highly sensitive to addressing patterns in order to achieve efficient use of the buses.

In the traditional memory system, the following READ cycle is typical: A memory cell in a memory array is selected by presenting a row address. The row address is decoded into a 1-of-n signal by a row decoder, and is then re-powered by driver circuits. The re-driven signals select the correct row in the memory array. The selected row in the memory array is read by sense amplifiers. The column address is decoded by a multiplexer to select the appropriate bit(s) from the row. In a write cycle, the column information is used to demultiplex the input data which, in turn, modifies the selected row.

With regard to the READ cycle in the traditional memory system, the locus of control flows through the memory chip leaving circuits idle in its wake. For example, while the memory array is being accessed, the row decoder sets idle. It is only after the end of a complete cycle that the circuits may be re-used.

SUMMARY OF THE INVENTION

Accordingly, it is a primary object of the present invention to provide a memory system wherein the components of the memory system may be continually and repeatedly utilized during a complete cycle of operation thereby achieving maximum utilization of the components which comprise the memory system.

It is another object of the present invention to provide a memory system which utilizes pipelining techniques in lieu of interleaving techniques during a READ from or WRITE to said memory system, the pipelining techniques achieving maximum utilization of the components which comprise the memory system.

It is yet a third object of the present invention to utilize said pipelining techniques to achieve a net increase in the number of memory references which may be accommodated in a unit of time by a particular memory system over non-pipelined alternatives.

These and other objects of the present invention are accomplished by designing a memory system which functions in accordance with a pipelining technique. In the memory system of the present invention, a plurality of latch circuits are placed at strategic locations within the memory system. For example, a latch circuit is placed between a row decoder and a driver circuit, between the driver circuit and a memory array, between the memory array and a plurality of sense amplifiers, and between the sense amplifiers and a multiplexer. A plurality of other latch circuits are placed at other locations within the memory system for the purpose of implementing the pipelining technique within the memory system of the present invention. The latch circuits store data values which are propagating through the memory system thereby permitting more frequent use of the memory system. As a result, all of the components of the subject memory system are continually and repeatedly utilized during a complete cycle of operation.

Further scope of applicability of the present invention will become apparent from the detailed description presented hereinafter. It should be understood, however, that the detailed description and the specific examples, while representing a preferred embodiment of the invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein.

DETAILED DESCRIPTION OF THE PREFERRED EMBODIMENT

Figure 1:
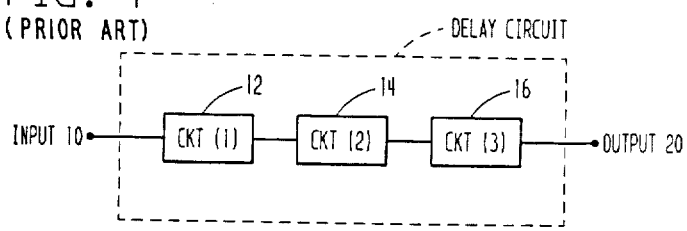
FIG. 1 illustrates a circuit which exhibits the property of a delay in time between the energization of the circuit by an input signal and the generation of a corresponding output signal from the circuit.

Referring to FIG. 1, a circuit is illustrated which exhibits the physical property of a time delay, that is, input signals are reflected as output signals only after a period of time has elapsed. In FIG. 1, a first input signal is propagated from input terminal 10 to output terminal 20 by way of circuit (1) 12 (abbreviated CKT (1)), circuit (2) 14 (abbreviated CKT (2)), and circuit (3) 16 (abbreviated CKT (3)). A second input signal may not begin its propagation through the circuit of FIG. 1 until the first input signal appears at output terminal 20. Unnecessary idle time is experienced with respect to the components of the circuit of FIG. 1. For example, CKT (1) 12 remains idle while the first input signal propagates through CKT (2) 14 and CKT (3) 16.

Figure 2:
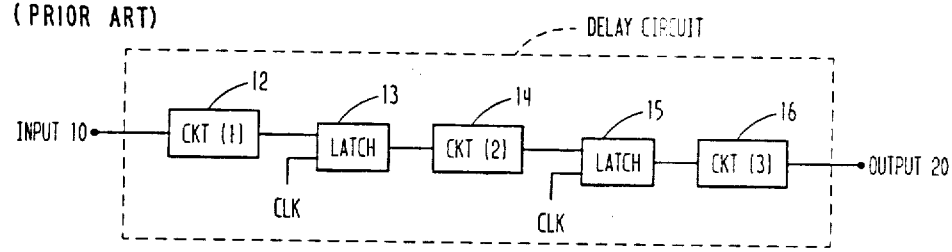
FIG. 2 illustrates another circuit which exhibits the property of the delay in time, this circuit including a plurality of latch circuits thereby illustrating the concept of pipelining.

Referring to FIG. 2, another circuit is illustrated exhibiting the same physical property of a time delay as mentioned with reference to FIG. 1, this circuit utilizing the concept of pipelining. In FIG. 2, CKT (1) 12 is connected at its output, and CKT (2) 14 is connected at its input to latch circuit 13. Similarly, CKT (2) 14 is connected at its output and CKT (3) 16 is connected at its input to latch circuit 15. In operation, when the first input signal propagates from input terminal 10, the first input signal becomes latched in latch circuit 13 in response to the clock signal "CLK". When the first input signal is latched in latch circuit 13, the second input signal at input terminal 10 may begin its propagation through CKT (1) 12 of FIG. 2. When the first input signal is latched in latch 15, and the second input signal is latched in latch 13, a third input signal may begin its propagation through the CKT (1) 12 of FIG. 2. Therefore, the individual circuits, CKT(1) 12, CKT(2) 14, and CKT(3) 16, of FIG. 2 are more frequently utilized relative to the CKT(1) 12, CKT(2) 14, and CKT(3) 16 of FIG. 1. Furthermore, with respect to the circuit of FIG. 2, when the first input signal arrives at output 20, a fourth input signal begins its propagation through the CKT (1) 12; however, with respect to FIG. 1, when the first input signal arrives at output 20, the second input signal begins its propagation through the CKT (1) 12. Therefore, the circuit of FIG. 2 is more efficient than the circuit of FIG. 1. Moreover, the rate at which subsequent inputs may be applied to the circuit of FIG. 1 is inversely proportional to the sum of the delays of CKT (1), CKT (2), and CKT (3) whereas the rate at which subsequent inputs may be applied to the circuit of FIG. 2 is inversely proportional to the maximum of either CKT (1), CKT (2), or CKT (3). Thus, assuming that CKT (1), CKT (2), and CKT (3) are realizable, physical devices whose time delay is strictly greater than zero, the circuit of FIG. 2 must necessarily be able to accept input values at a faster rate than the circuit of FIG. 1.

Figure 3:
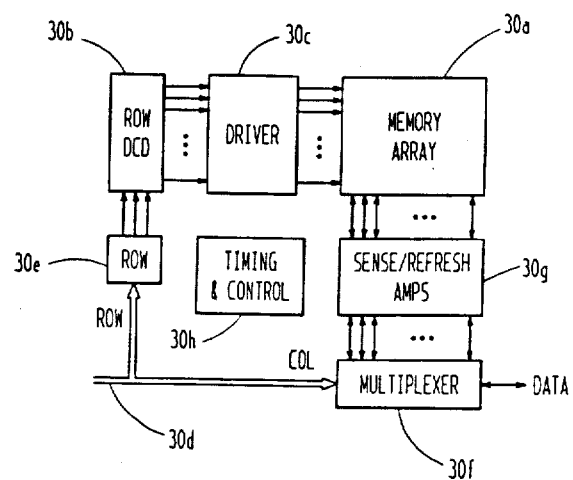
FIG. 3 illustrates a typical memory system.

Referring to FIG. 3, a typical memory system 30 is illustrated. In FIG. 3, the memory system 30 includes a memory array 30a including a plurality of rows and a plurality of intersecting columns, the intersection of a single row and a single column defining the location of a single memory cell. A row decoder 30b is connected to each of the rows of the memory array 30a by way of a driver circuit 30c. A row address is received by the row decoder 30b from bus 30d by way of a row address register 30e. Each of the columns of memory array 30a are connected to corresponding inputs of multiplexer 30f by way of a plurality of corresponding sense/refresh amplifiers 30g. The functioning of the component elements in the memory system 30 of FIG. 3 is controlled by a timing and control circuit 30h.

In operation, referring to FIG. 3, a row address on bus 30d is stored in row address register 30e and is decoded by row decoder 30b. The row decoder 30b develops one output signal energizing driver circuit 30c. The driver circuit 30c develops a corresponding output signal energizing and selecting the corresponding row of the memory array 30a. The data stored in each cell of the corresponding row is read from the corresponding row of the memory array 30a, the data being represented by a plurality of output signals developed from the memory array 30a and energizing the multiplexer 30f by way of the sense/refresh amplifiers 30g. Since the bus is time multiplexed with respect to the row and column addresses, following the appearance of the row address on bus 30d, a column address appears on bus 30d. The column address, on bus 30d, energizes the multiplexer 30f thereby selecting one of the plurality of output signals energizing the multiplexer 30f. Therefore, data stored in one cell of the corresponding row is read from memory array 30a and selected by multiplexer 30f in accordance with the column address on bus 30d.

Figure 4:
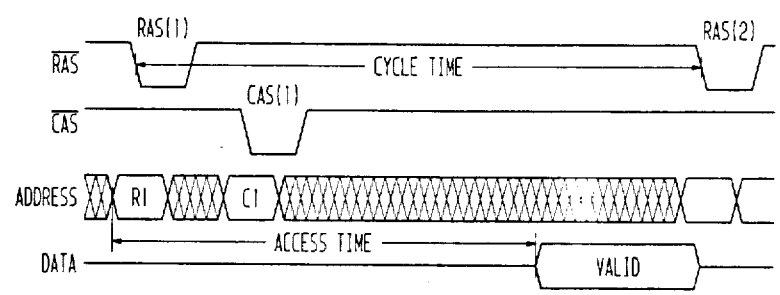
FIG. 4 illustrates the clock signals which drive the memory system of FIG. 3.

Referring to FIG. 4, a timing diagram is illustrated associated with the memory system 30 of FIG. 3. In FIG. 4, a Row Address Select (RAS) clock signal is shown, this clock signal energizing the row address register 30e. A Column Address Select (CAS) clock signal is shown, this clock signal energizing column circuitry (not shown) of the memory system 30 of FIG. 3. In FIG. 4, the signal labelled "ADDRESS" comprises row and column address signals, the row and column address signals appearing on the bus 30d in a time multiplexed manner. Since the bus 30d is time multiplexed, a row and column address will not appear on bus 30d simultaneously. For example, when a row address (R1) appears on bus 30d, a column address (C1) will not appear on the bus. The RAS clock signal for each access operation comprises a single pulse. As shown in FIG. 4, the pulse RAS(1) is associated with the first access, and pulse RAS(2) is associated with the subsequent access. This is similarly true with respect to the CAS clock signal. As drawn, both the RAS and CAS signals are logically significant when low. When pulse RAS(1) of the RAS clock signal energizes the row address register 30e, a row address (R1), on bus 30d, is stored in the row address register 30e. When an output signal is generated from multiplexer 30f in response to the row address stored in row address register 30e, pulse RAS(2) of the RAS clock signal energizes the row address register 30e thereby storing another row address (R2) in row address register 30e. In FIG. 4, notice the cycle time between generation of pulse RAS(1) and pulse RAS(2) of the RAS clock signal.

However, with respect to the memory system of FIG. 3, following the interrogation of the memory system 30 with a first row and column address, it is necessary to wait for the generation of an output signal from multiplexer 30f, representing a first piece of data read from memory array 30a, before a second row and column address on bus 30d may be utilized for the interrogation of the memory system 30. Therefore, the individual elements of FIG. 3 remain idle a large portion of the elapsed time during the reading of the first piece of data from array 30a. Furthermore, the cycle time strictly limits the rate at which new addresses may be presented to the memory.

Figure 5:
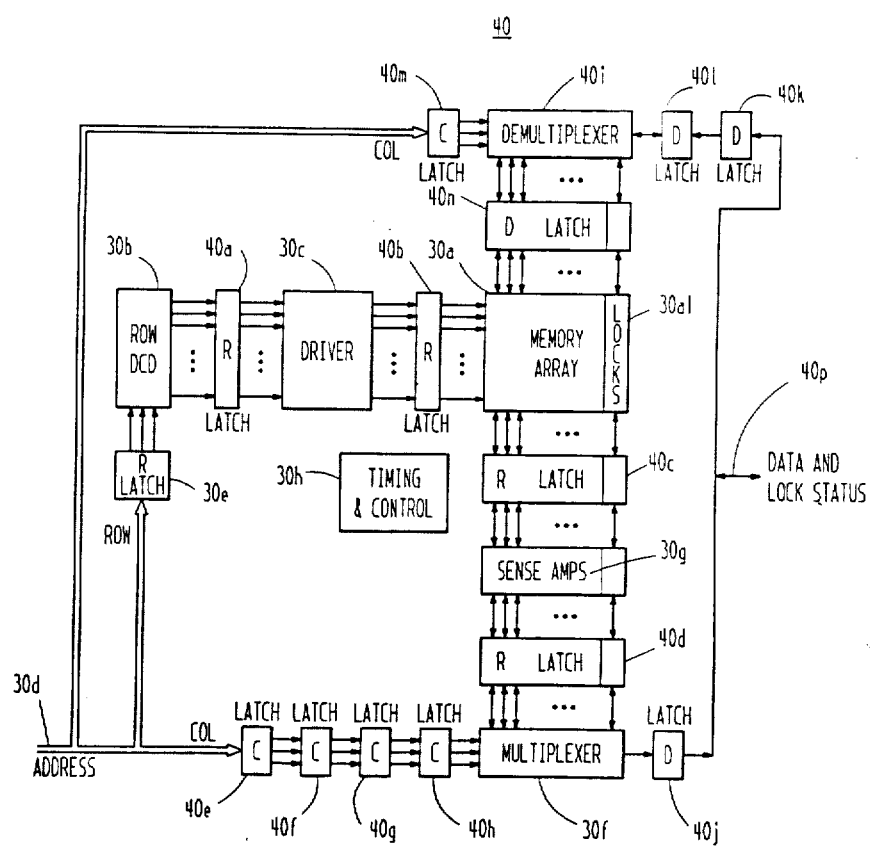
FIG. 5 illustrates a memory system in accordance with the present invention which utilizes the concept of pipelining illustrated in FIG. 2.

Referring to FIG. 5, a memory system 40 in accordance with the present invention is illustrated. The individual elements of the memory system of FIG. 5 are utilized more frequently during the reading of a single piece of data from array 30a relative to the elements of the memory system of FIG. 3. Moreover, the cycle time is dramatically reduced. Therefore, the memory system of FIG. 5 is more efficient than the memory system of FIG. 3.

In FIG. 5, the memory system 40 comprises the memory array 30a including a plurality of rows and a plurality of intersecting columns, the intersection of a single row and a single column defining the location of a single memory cell, similar to the FIG. 3 memory array. The memory array 30a of FIG. 5 includes a separate column termed "locks" 30a1. The locks column 30a1 includes a plurality of bits stored in column fashion therein. Therefore, each row of the memory array 30a of FIG. 5 includes a lock bit stored as part of the locks column 30a1.

The function of the lock bit will be described in the following paragraphs as a part of the functional description of the present invention. A row decoder 30b is connected to each of the rows of the memory array 30a by way of a driver circuit 30c. A row address is received by the row decoder 30b from bus 30d by way of a row address register 30e. However, a first group of latch circuits 40a are connected between the row decoder 30b and the driver circuit 30c. A second group of latch circuits 40b are connected between the driver circuit 30c and the memory array 30a.

Each of the columns of memory array 30a are connected to corresponding inputs of multiplexer 30f by way of a plurality of corresponding sense/refresh amplifiers 30g. The functioning of the component elements in the memory system 40 of FIG. 5 is controlled by a timing and control circuit 30h. However, a third group of latch circuits 40c are connected between the sense amplifiers 30g and the memory array 30a. A fourth group of latch circuits 40d are connected between multiplexer 30f and the sense amplifiers 30g. The column address portion of bus 30d is connected to multiplexer 30f by way of four latch circuits, latch circuits 40e, 40f, 40g, and 40h, the four latch circuits being connected in series fashion. The output of multiplexer 30f is connected to a de-multiplexer 40i by way of three further latch circuits, latch circuits 40j, 40k, and 40L. The column address portion of bus 30d is further connected to de-multiplexer 40i by way of another latch circuit 40M. Another group of latch circuits 40N is connected between the de-multiplexer 40i and the memory array 30a.

Figure 6:
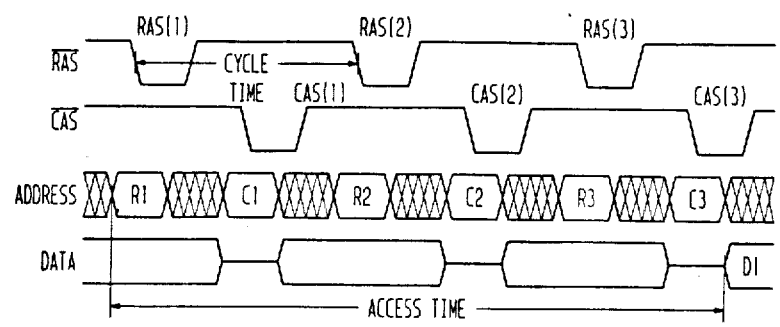
FIG. 6 illustrates the clock signals which drive the latch circuits of FIG. 5.

Referring to FIG. 6, a plurality of waveforms associated with the memory system 40 of FIG. 5 is illustrated. In FIG. 5, a Row Address Select (RAS) clock signal is illustrated, the RAS clock signal being comprised of a RAS(1) pulse, a RAS(2) pulse, and a RAS(3) pulse. A Column Address Select (CAS) clock signal is illustrated, the CAS clock signal being comprised of a CAS(1) pulse, a CAS(2) pulse, and a CAS(3) pulse. The RAS and CAS clock signals set the various latch circuits present in the memory system 40 of FIG. 5. A signal termed ADDRESS comprises the various row and column addresses (R1, C1, R2, C2, etc.) present on bus 30d in a time multiplexed manner shown in FIG. 5. In a fashion identical to that of the circuit of FIG. 3, a row and a column address will not appear on bus 30d simultaneously. For example, when a row address (R1) appears on bus 30d, a column address (C1) will not appear on the bus. In FIG. 5, note that the leading edge of the RAS(1) pulse of the RAS clock signal corresponds to the row address R1, the leading edge of the CAS(1) pulse of the CAS clock corresponds to the column address C1, etc.

The circuit of FIG. 6 observes the traditional discipline of pipelined circuits controlled by a two phase clock. These two clock phases are exactly the signals RAS and CAS. It is always the case that each latch in the circuit is connected to either RAS or CAS, but never both. Furthermore, all latches connected to RAS will operate on every RAS pulse.

In a similar fashion, all latches connected to CAS will operate on every CAS pulse. Correct operation requires that a latch set by a RAS pulse will provide its output only to a latch set by a CAS pulse; and a latch set by a CAS pulse will provide its output only to a latch set by a RAS pulse.

Referring to FIG. 5, latch circuits 30e, 40b, 40d, 40f, 40h, 40k, and 40n are all connected to the RAS signal and are set in synchronism with one another. The remaining latch circuits 40a, 40c, 40e, 40g, 40j, 40l, and 40m are connected to the CAS signal and are set in synchronism with one another.

The functional operation of the memory system 40 in accordance with the present invention will be presented in the following paragraphs with reference to FIG. 5 of the drawings.

In FIG. 5, a first row address R1 and a first column address C1 appears on bus 30d, in a time multiplexed manner, the first row address R1 energizing row address register 30e and being stored therein in response to pulse RAS(1) of the RAS pulse.

The first row address R1 is decoded by row decoder 30b, the row decoder generating output signals representing the decoded first row address, the decoded first row address being stored in latch circuit 40a in response to pulse CAS(1) of the CAS clock signal. When the CAS(1) pulse is generated storing the decoded first row address in latch circuit 40a, the first column address C1 is stored in latch 40e in response to pulse CAS(1).

The decoded first row address energizes driver circuit 30c, the driver circuit re-transmitting a signal representing the decoded first row address, the decoded first row address being stored in latch circuit 40b in response to pulse RAS(2) of the RAS clock signal. In the meantime, the first column address C1 is re-stored in latch 40f in response to pulse RAS(2) of the RAS clock signal. As a result, latch circuits 40a and 40e are free for storage therein of other row and column addresses. Consequently, a second row address R2 energizes row decoder 30b (via row address register 30e) and latch circuit 40e in a time multiplexed manner. Therefore, at this point in time, the decoded first row address is stored in latch circuit 40b in response to pulse RAS(2) of the RAS clock signal and the first column address C1 is stored in latch circuit 40f in response to pulse RAS(2) of the RAS clock signal. A second row address is stored in row address register 30e.

A second column address C2 energizes row decoder 30b (via row address register 30e) and latch circuit 40e in a time multiplexed manner. A decoded second row address is stored in latch circuit 40a in response to pulse CAS(2) of the CAS clock signal and a second column address C2 is stored in latch circuit 40e in response to pulse CAS(2) of the CAS clock signal. The decoded first row address, in latch 40b, energizes memory array 30a. The data stored in a row of memory array 30a, corresponding to the decoded first row address, is read therefrom and stored in latch circuit 40c in response to pulse CAS(2) of the CAS clock signal. In the meantime, the first column address is re-stored in latch circuit 40g in response to pulse CAS(2) of the CAS clock signal.

The decoded second row address, in latch 40a, is re-stored in latch 40b in response to pulse RAS(3) of the RAS clock signal. The second column address, in latch 40e, is re-stored in latch 40f in response to pulse RAS(3) of the RAS clock signal. Therefore, latch 40a and 40e are free, for storage therein, of a third decoded row address and a third column address, respectively. Bus 30d supplies the third row address R3, stored in row address register 30e during RAS(3). The data, corresponding to the first decoded row address, stored in latch 40c, is sensed, read from latch 40c, and stored in latch circuits 40d in response to pulse RAS(3) of the RAS clock signal. The first column address C1, in latch 40g, is re-stored in latch 40h in response to pulse RAS(3) of the RAS clock signal.

Bus 30d supplies the third column address C3 in a time multiplexed manner, a third decoded row address being stored in latch 40a in response to pulse CAS(3) of the CAS clock signal, the third column address C3 being subsequently stored in latch 40e in response to pulse CAS(3) of the CAS clock signal. Data stored in a row of memory array 30a, corresponding to the second decoded row address, in latch 40b, is read and stored in latch circuits 40c in response to pulse CAS(3) of the CAS clock signal. The second column address C2, in latch 40f, is re-stored in latch 40g in response to pulse CAS(3) of the CAS clock signal. Bus 30d supplies the fourth row address. The data stored in latch circuits 40d, corresponding to the first decoded row address, comprises a plurality of data elements corresponding to the plurality of columns in the memory array 30a. One of the data elements, in latch circuits 40d, is selected by multiplexer 30f in accordance with the first column address C1, in latch circuit 40h, energizing the multiplexer 30f. The one data element is stored in latch circuit 40j in response to pulse CAS(3) of the CAS clock signal. At this point, the one data element, corresponding to the first decoded row address and the first column address C1, is stored in latch 40j. The data element is available for use at the output during the CAS(3) pulse.

The third decoded row address, in latch 40a, is re-stored in latch circuits 40b in response to pulse RAS(4) of the RAS clock signal. The third column address C3, in latch 40e, is re-stored in latch 40f in response to pulse RAS(4) of the RAS clock signal. Therefore, latch 40a and 40e are free, for storage therein, of a fourth decoded row address and a fourth column address, respectively. Bus 30d supplies a fourth row address R4, stored in the row address register 30e during RAS (4). The data, corresponding to the second decoded row address, stored in latch 40c, is sensed, read from latch 40c, and stored in latch circuits 40d in response to pulse RAS(4) of the RAS clock signal. The second column address C2, in latch 40g, is re-stored in latch 40h in response to pulse RAS(4) of the RAS clock signal.

Note that the events which occur during the generation of pulse RAS(4) are identical to the events which occur during the generation of pulse RAS(3). Similarly, the events which occur during the generation of pulse CAS(4) are identical to the events which occur during the generation of pulse CAS(3), etc. Therefore, at this point, the memory system of FIG. 5 has reached steady state operation.

A write operation is fundamentally similar to the read operation described above. Such a write operation is described in the following paragraphs:

Referring to FIG. 5, a first row address R is presented on bus 30d in a time multiplexed manner, the first row address R1 energizing row address register 30e and being stored therein in response to pulse RAS(1) of the RAS pulse. Simultaneously, the datum to be written is applied to the "DATA AND LOCK STATUS LINE" 40P thereby energizing latch 40k and being stored therein in response to the pulse RAS(1). The first row address R1 is decoded by row decoder 30b, the decoded first row address being stored in latch circuit 40a in response to pulse CAS(1), simultaneously storing the column address C1 in latch 40m and the datum to be written in latch 40L. The decoded first row address energizes driver circuit 30c, the driver circuit re-transmitting a signal representing the decoded first row address, the decoded first row address being stored in latch circuit 40b in response to pulse RAS(2). In the meantime, the first column address C1 is used to properly route the datum to be written through the demultiplexer circuit 40i, the demultiplexed output being stored in latch circuit 40n in response to pulse RAS(2). The decoded first row address, in latch 40b, energizes memory array 30a. The data stored in latch 40n is written to a row of memory array 30a corresponding to the decoded row and column addresses.

As a result, due to the presence of the latch circuits 40a through 40N, the individual elements of the memory array 40 of FIG. 5 are utilized more frequently, during either the reading or the writing of a single piece of data from the memory array 30a, than are the individual elements of the memory array 30 of FIG. 3. As a result, the memory system of FIG. 5 is more efficient and can support a shorter cycle time the memory system of FIG. 3. For these reasons, the memory system of FIG. 5 is superior to the memory system of FIG. 3.

The functional operation of the memory system 40 of the present invention in conjunction with the lock bits stored in the locks column 30a1 of the memory array 30a of FIG. 5 will be presented in the following paragraphs with reference to FIG. 5 of the drawings.

The pipelined memory system 40 of FIG. 5 may be accessed by a plurality of independent but communicating processes being carried out by one or more possibly pipelined processors. For example, during time t1, process 1 may be accessing a location in memory system 40, and during time t2>t1, process 2 may be accessing the same location in memory system 40. During time t3>t2, process 1 may re-access the location in memory system 40, and during time t4>t3, process 2 may re-access the location in memory system 40. Assume that process 1 and process 2 are both performing read-modify-write cycles. Since process 1 is performing a read-modify-write cycle and data is read from memory system 40 during time t1, process 1 may not be capable of writing new data to memory system 40 until time t3. However, during this time frame, process 2 is accessing the memory system 40, reading data during time t2. Process 2 should not be allowed to read data from the location in question in memory system 40 until process 1 has completed writing its new data to the same location in memory system 40.

In order to prevent process 2 from reading data from the location in question in memory 40 prior to the completion of the writing of new data to the same location in memory 40 by process 1, the lock bits of the lock column 30a1 are utilized. When process 1 reads data from memory 40 during time t1, the lock bit associated with a row from which the data is read is set, for example, to one (1). When processor 2 reads data from the same row during time t2, it reads a "one" lock bit. Therefore, process 2 cannot read data from that row because the lock bit, which it read from that row, was set to one. When process 1 writes its new data to the row, the lock bit is reset to zero (0). If process 2 subsequently re-reads data from that row, since the lock bit associated with that row is now a zero, process 2 can subsequently proceed to read the new data and subsequently write newer data.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A high performance pipelined memory system for reading data from memory in a pipelined fashion, comprising:
   an address bus;
   a data output line;
   a memory array having rows and columns wherein one of said columns is a lock column;
   a multiplexer having a first and second input and an output;
   row selection means, connected between said address bus and said memory array, for selecting a row of data from said memory array;
   row refresh means, connected between said memory array and said multiplexer at said first input, for refreshing said requested row of data;
   column selection delay means, connected between said address bus and said multiplexer at said second input, for selecting a column from said selected row of data and for assuring that said selected column and said selected row of data arrive at their respective inputs of said multiplexer at substantially the same time,
   wherein a plurality of subsequent row selections and column selections can be propagated through said system before the data resulting from the first row selection and column selection appears at said output line, and
   wherein said lock column is for storing information that a first processor is using said selected row of data, thereby inhibiting subsequent processors from using said selected row of data until said first processor has completed using said selected row of data.

2. The memory system of claim 1 wherein said row selection means comprises:
   a first latch, connected to said address bus;
   a row decoder, connected to said first latch;
   a second latch, connected to said row decoder;
   a driver circuit, connected to said second latch; and
   a fourth latch, connected to said driver circuit.

3. The memory system of claim 2, wherein said row refresh means comprises:
   a sixth latch, connected to said memory array;
   a sense amplifier refresh circuit, connected to said sixth latch; and
   an eighth latch, connected to said sense amplifier refresh circuit.

4. The memory system of claim 3, wherein said column selection delay means comprises:
   a third latch, connected to said address bus;
   a fifth latch, connected to said third latch;
   a seventh latch, connected to said fifth latch; and
   a ninth latch, connected to said seventh latch.

5. The memory system of claim 4, further comprising:
   first clocking means for clocking said first, fourth, fifth, eighth, and ninth latches; and
   second clocking means for clocking said second, third, sixth, seventh, and tenth latches.

6. A high performance piepllined memory system for writing data to memory in a pipelined fashion, comprising:
   an address bus;
   a data input line;
   a memory array having rows and columns wherein one of said columns is a lock column;
   a demultiplexer having a first and second input and an output;
   row selection means, connected between said address bus and said memory array, for selecting a row of data from said memory array;
   data delay means, connected between said data input line and said demultiplexer at said first input, for delaying said data to be written from arriving at said demultiplexer;
   column selection delay means, connected between said address bus and said demultiplexer at said second input, for selecting a column from said selected row of data and for assuring that said selected column and said delayed data arrive at their respective inputs of said demultiplexer at substantially the same time,
   wherein a plurality of susequent row selections, column selections, and data to be written can be propagated through said system before the data from said data input line is written to said selected row and said selected column of said memory array, and
   wherein said lock column is for storing information that a first processor is using said selected row of data, thereby inhibiting subsequent processors from using said selected row of data.

7. A method of reading data from a memory array having rows and columns in a pipeland memory system having an address bus, a data output link and a first and second clocking means, comprising the steps of:
   placing a first requested row address on said address bus and latching said first requested row address in a first latch responsive to said first clocking means;
   decoding said first requested row address, latching said first requested row address in a second latch responsive to said second clocking means, placing a first requested column address on said address bus, and latching said first requested column address in a third latch also responsive to said second clocking means;
   driving said first requested row address, latching said first requested row address in a fourth latch responsive to said first clocking means, latching said first requested column address in a fifth latch also responsive to said first clocking means, placing a second requested row address on said address bus, and latching said second requested row address in said first latch also responsive to said first clocking means;
   retrieving first requested row data from said memory array, latching said first requested row data in a sixth latch responsive to said second clocking means, latching said first requested column address in a seventh latch also responsive to said second clocking means, placing a second requested column address on said address bus, decoding said second requested row address, latching said second requested row address in said second latch also responsive to said second clocking means, and latching said second requested column address in said third latch also responsive to said second clocking means;
   sensing said first requested row data, latching said first requested row data in an eighth latch responsive to said first clocking means, latching said first requested column address in a ninth latch also responsive to said first clocking means, driving said second requested row address, latching said first requested row address in said fourth latch also responsive to said first clocking means, latching said second requested column address in said fifth latch also responsive to said first clocking means, placing a third requested row address on said address bus, and latching said third requested row address in said first latch also responsive to said first clocking means;

multiplexing said first requested row data with said first requested column address and latching the resulting data in a tenth latch responsive to said second clocking means, retrieving second requested row data from said memory array, latching said second requested row data in said sixth latch also responsive to said second clocking means, latching said second requested column address in said seventh latch also responsive to said second clocking means, placing a third requested column address on said address bus, decoding said third requested row address, latching said third requested row address in said second latch also responsive to said second clocking means, and latching said third requested column address in said third latch also responsive to said second clocking means.

* * * * *

UNITED STATES PATENT AND TRADEMARK OFFICE
CERTIFICATE OF CORRECTION

PATENT NO. : 4,685,088

DATED : August 4, 1987

INVENTOR(S) : Robert A. Iannucci

It is certified that error appears in the above-identified patent and that said Letters Patent is hereby corrected as shown below:

Claim 6
Col. 10, line 26   After "data" insert --until said first processor has completed using said selected row of data--.

Claim 7
Col. 10, line 29   Delete "link" and insert therefor --line--.

Signed and Sealed this

Twenty-ninth Day of March, 1988

Attest:

DONALD J. QUIGG

*Attesting Officer*          *Commissioner of Patents and Trademarks*